(12) United States Patent
Merry et al.

(10) Patent No.: US 8,724,976 B2
(45) Date of Patent: *May 13, 2014

(54) USE OF INFRARED CAMERA FOR REAL-TIME TEMPERATURE MONITORING AND CONTROL

(75) Inventors: Nir Merry, Mountain View, CA (US); Stephen Moffatt, St. Lawrence (JE); Kailash Patalay, Santa Clara, CA (US); David Keith Carlson, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 105 days.

This patent is subject to a terminal disclaimer.

(21) Appl. No.: 13/433,780

(22) Filed: Mar. 29, 2012

(65) Prior Publication Data

US 2012/0183915 A1    Jul. 19, 2012

Related U.S. Application Data

(63) Continuation of application No. 12/263,349, filed on Oct. 31, 2008, now Pat. No. 8,150,242.

(51) Int. Cl.
*F26B 3/30* (2006.01)
*F26B 19/00* (2006.01)

(52) U.S. Cl.
USPC ............ 392/411; 392/407; 392/416; 392/418

(58) Field of Classification Search
None
See application file for complete search history.

(56) References Cited

U.S. PATENT DOCUMENTS

| | | | | |
|---|---|---|---|---|
| 5,155,336 A * | 10/1992 | Gronet et al. | ................. | 219/411 |
| 5,700,180 A * | 12/1997 | Sandhu et al. | ..................... | 451/5 |
| 5,790,751 A * | 8/1998 | Gronet et al. | ................. | 392/416 |
| 6,016,383 A * | 1/2000 | Gronet et al. | ................. | 392/416 |
| 6,122,439 A * | 9/2000 | Gronet et al. | ................. | 392/416 |
| 6,441,351 B2 * | 8/2002 | Hayasaki et al. | ............. | 219/502 |
| 6,534,752 B2 * | 3/2003 | Camm et al. | ................. | 219/497 |
| 6,919,538 B2 * | 7/2005 | Szekeresch et al. | .......... | 219/390 |
| 7,184,657 B1 * | 2/2007 | Camm et al. | ................. | 392/418 |
| 7,398,014 B1 * | 7/2008 | Camm et al. | ................. | 392/418 |
| 7,575,501 B1 * | 8/2009 | Molnar | ............................. | 451/5 |

* cited by examiner

Primary Examiner — Thor Campbell
(74) Attorney, Agent, or Firm — Patterson & Sheridan, LLP

(57) ABSTRACT

Embodiments of the invention generally contemplate an apparatus and method for monitoring and controlling the temperature of a substrate during processing. One embodiment of the apparatus and method takes advantage of an infrared camera to obtain the temperature profile of multiple regions or the entire surface of the substrate and a system controller to calculate and coordinate in real time an optimized strategy for reducing any possible temperature non-uniformity found on the substrate during processing.

20 Claims, 4 Drawing Sheets

USE OF INFRARED CAMERA FOR REAL-TIME TEMPERATURE MONITORING AND CONTROL

CROSS-REFERENCE TO RELATED APPLICATION

This application is a continuation application of co-pending U.S. patent application Ser. No. 12/263,349, filed on Oct. 31, 2008, which is herein incorporated by reference.

BACKGROUND OF THE INVENTION

1. Field of the Invention

Embodiments of the present invention generally relate to semiconductor manufacturing and specifically the use of infrared camera for real-time temperature monitoring and control.

2. Description of the Related Art

Virtual Metrology (VM), an increasingly critical component of semiconductor manufacturing control, is a technology to predict metrology variables using information about the state of the process for every substrate. The idea of Virtual Metrology is to construct predictive models that can forecast the electrical and physical metrology variables of substrates, based on data collected from the relevant processing tools, such as temperature, power, flow rate, pressure, optical emission spectrum, plasma impedance, etc. In this way, the time consuming and costly direct measurements of the metrology variables of the substrate can be minimized or eliminated altogether. Virtual Metrology in conjunction with Advanced Process Control (APC) can provide real-time feed-forward control (i.e. to the next process step) and feed-backward control (i.e. to the previous process step) to compensate for disturbance of an upstream process.

High temperature processing systems, such as a rapid thermal processing (RTP) reactor and a chemical vapor deposition (CVD) epitaxial reactor, require a substantially uniform temperature profile across the substrate. In some advanced processes, it is important to have a substantially small temperature gradient from about 2 mm inside the edge of the substrate. Particularly, it may be necessary to heat a substrate to a temperature between about 200° C. to about 1350° C. with a temperature deviation of only about 1° C. to 1.5° C. across the substrate. In such processes, the temperature uniformity may be improved by controlling heat sources, such as a laser and an assembly of lamps that are configured to heat the substrate on the front side while a reflective surface on the back side reflects heat back to the substrate. Furthermore, point temperature measurement and compensation methodology, such as Virtual Metrology and Advanced Process Control, have been used to improve the temperature gradient across the substrate. Examples Individual temperature sensors, such as pyrometers, have been used to take point measurement of the substrate temperature as input data into the Virtual Metrology and Advanced Process Control system. Conventional processing systems typically use a small number of sensors due to space and cost constraints. To accurately measure the temperature profile of the entire substrate, a prohibitively large number of sensors would be required.

Therefore, there is a need for apparatus and methods to accurately monitor and control in real time the temperature profile across the entire substrate in a processing system.

SUMMARY OF THE INVENTION

The present invention generally provides an apparatus for processing a substrate, comprising a chamber body having a processing volume, a substrate support that is disposed in the processing volume, a heat source having a plurality of heating elements that are configured to transfer an amount energy to a region of a surface of the substrate that is disposed on the substrate support, a temperature sensor assembly that is configured to measure a temperature profile of the region of the surface of the substrate, wherein the temperature sensor assembly comprises an infrared camera, an actuator that is configured to rotate the substrate support, a position sensor assembly that is coupled to the substrate support, and is configured to monitor the angular position or rotation speed of the substrate support, and a system controller that is in communication with the heat source, temperature sensor assembly, actuator, and position sensor assembly, and is configured to adjust the amount of energy delivered by at least one of the heating elements to a portion of the region of the surface of the substrate during processing.

The present invention also provides a method for processing a substrate, comprising placing a substrate on a substrate support, heating a first region of a surface of the substrate using a heat source, wherein the heat source comprises a plurality of heating elements that are grouped into independently controllable zones, forming a first thermal image of the first region of the surface of the substrate using an infrared camera, determining the location of a first area of temperature non-uniformity on the surface of the substrate using the first thermal image, and adjusting the energy delivered by a first zone of heating elements to reduce the temperature non-uniformity, wherein the first zone of heating elements is positioned closer to the first area of temperature non-uniformity than all other zones of heating elements.

The present invention also provides a method for processing a substrate, comprising placing a substrate on a substrate support, heating a surface of the substrate using a heat source, measuring a first temperature profile of a region of the surface of the substrate using a first device, wherein the first device is an infrared camera, measuring a second temperature profile of the region of the surface of the substrate using a plurality of second devices, comparing an area of the second temperature profile with the corresponding area of the first temperature profile, and adjusting each of the plurality of second devices such that the second temperature profile matches the first temperature profile.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally contemplate an apparatus and method for monitoring and controlling the temperature of a substrate during processing. One embodiment of the apparatus and method takes advantage of an infrared camera to obtain the temperature profile of multiple regions or the entire surface of the substrate and a system controller to calculate and coordinate in real time an optimized strategy for reducing any possible temperature non-uniformity found on the substrate during processing.

Figure 1:
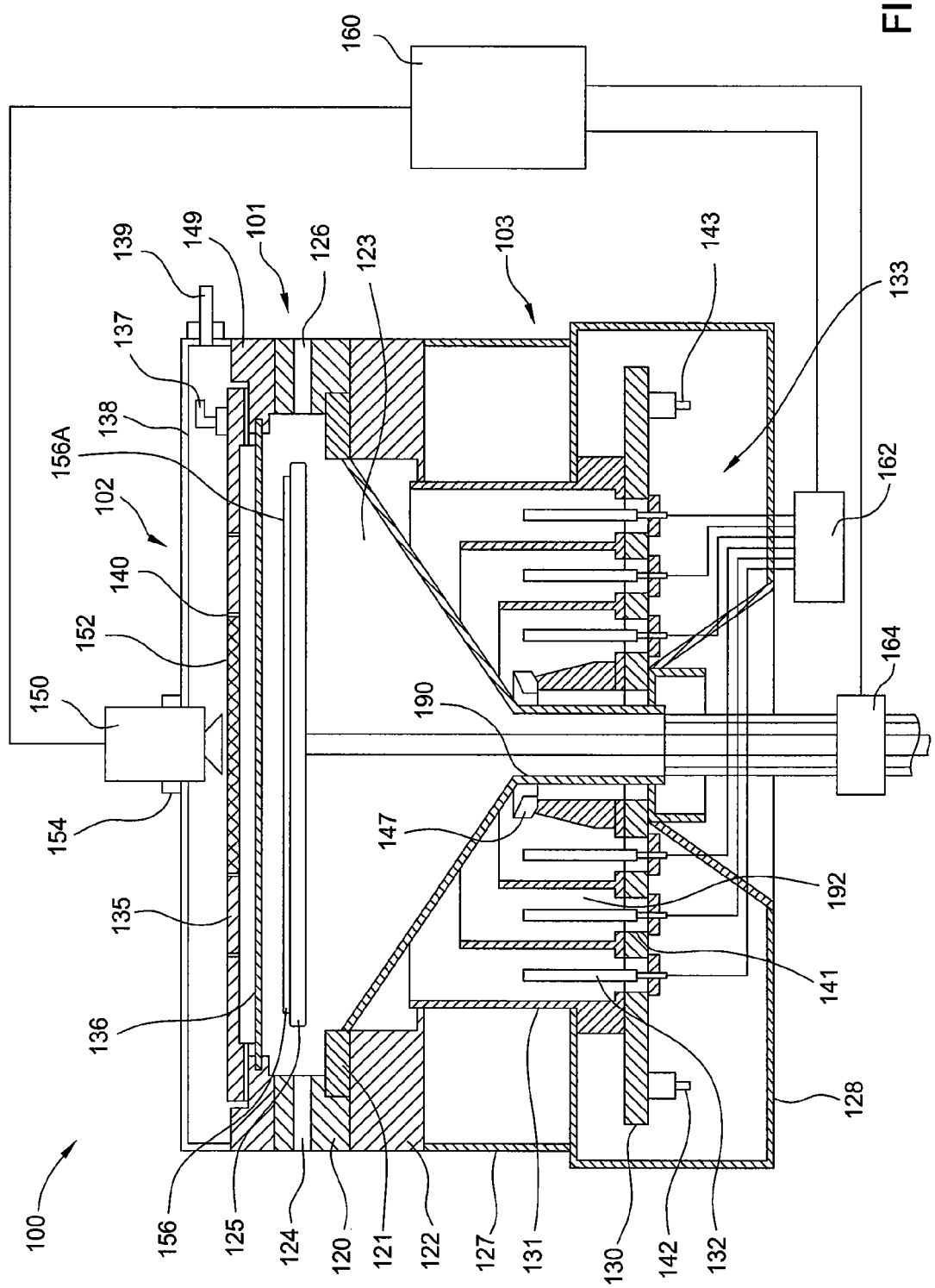
FIG. 1 shows a schematic cross sectional view of a processing system according to one embodiment of the invention.

FIG. 1 schematically illustrates a cross sectional view of a processing system 100 having a process chamber 101, an upper reflector module 102, a lower lamp module (or a heat source) 103, and a system controller 160 in one embodiment, wherein the processing chamber 101 is configured to form an epitaxial layer on a substrate positioned in a chamber volume 123 contained within the processing chamber 101. While an expitaxial reactor is generally used to illustrate one or more embodiments of the invention, this configuration is not intended to be limiting as to the scope of the invention described herein. Also, the configuration of the reactor and the arrangement of the reactor components, for example, the physical shape, layout, and position of the process chamber, the reflector module, the lamp module, and the system controller, are not intended to be limiting as to the scope of the invention described herein unless explicitly set forth in the claims.

As shown in FIG. 1, the process chamber 101 comprises a base plate 120 having a circular opening where a lower dome 121 is positioned and secured by a lower clamp ring 122. The lower dome 121 is dish shaped and has an aperture 190 formed in a center. The lower dome 121 and a chamber lid 149 positioned above the base plate 120 define the chamber volume 123 wherein a substrate support assembly 125, which is configured to be rotated by an actuator, may be disposed for support of a substrate 156 during process. In one embodiment, the base plate 120 and the lower clamp ring 122 may be made of metal, such as aluminum, nickel plated aluminum, and stainless steel. The lower dome 121 may be made of quartz which resists most processing gases and has good thermal properties. The base plate 120 may have an inject port 124 formed on one side. The chamber lid 149 may have a cover plate 136 positioned above the area where the substrate 156 is processed. The cover plate 136 may be made of quartz. In one embodiment, the cover plate 136 made of quartz enables uniform heating to the chamber volume 123 in combination with an upper heating assembly present. The inject port 124 is configured to adapt an inlet cap for processing gases. An exhaust port 126 is formed on an opposite side of the inject port 124. The exhaust port 126 may adapt to a vacuum source to maintain the pressure inside the process chamber 101.

As shown in FIG. 1, the upper reflector module 102 is attached to the chamber lid 149 and comprises a reflector plate 135 configured to reflect heat energy to the chamber volume 123. The reflector plate 135 may be enclosed in a cover 138. The reflector plate 135 may have a plurality of through holes 140 formed therein. The plurality of through holes 140 may enable cooling air to be circulated inside the upper reflector module 102 and/or provide paths for pyrometers or other sensors. The reflector plate 135 is configured to be cooled by liquid via inlet 137. In one embodiment, the reflector plate 135 may be made from a gold plated metal. The upper reflector module 102 may further comprise an air inlet 139 disposed on the cover 138 and configured to provide cooling air to the inside of the upper reflector module 102.

As shown in FIG. 1, the lower lamp module 103 is attached to the process chamber 101 and configured to heat the process chamber 101 through the lower dome 121. The lower lamp module 103 comprises a lamp assembly 133 that consists of a plurality of vertically oriented lamps (or heating elements) 132 disposed in a plurality of openings 192 defined by a cooling plate 130 and a lower reflector assembly 131. The lower lamp module 103 further comprises a bottom cover 128 which is removable from side walls 127. The lamps 132 may be repaired and serviced from the bottom. A liquid inlet 142 and a liquid outlet 143 are formed in the cooling plate 130. The liquid cooled cooling plate 130 also reduces air cooling for the system, hence, reducing overall system size.

As shown in FIG. 1, the lower reflector assembly 131 is disposed above the cooling plate 130 and is configured to direct heat energy from the lamps 132 towards the lower dome 121. In one embodiment, an inner reflector 147 may be positioned near a center of the lower reflector assembly 131 to surround the lower aperture 190 of the lower dome 121. The lower reflector assembly 131 comprises a base plate 148. A plurality of apertures 144 corresponding to the plurality of apertures 141 on the cooling plate 130 are formed on the base plate 148. The plurality of apertures 144 are configured to hold the plurality of lamps 132 therein. A plurality of vertical reflecting walls 146 extend upwards from the base plate 148, and are concentric with one another and configured to direct the heat energy from the lamps 132 towards the lower dome 121. In one embodiment, the lower reflector assembly 131 may be made from gold plated metal.

As shown in FIG. 1, an infrared (IR) camera 150, a part of a temperature sensor assembly, is positioned in the upper reflector module 102 with the lens facing the chamber volume 123. The IR camera is used to take digital snapshots of the temperature profile across regions of or the entire surface 156A of the substrate 156, which is positioned in the chamber volume 123. A composite temperature profile can optionally be created by combining the temperatures profiles of multiple regions of the substrate surface. A substrate-level temperature profile generally provides more detailed and higher resolution temperature data than discrete or point measurements made by individual sensors, such as pyrometers. The temperature data may be used to calibrate one or more temperature sensors disposed in the process chamber 101, such as the ones implemented in the reflector plate 135, and also may be used to detect substrate placement, breakage, and thermal environment within the interior of the process chamber 201. Also, the temperature data may improve the accuracy of virtual metrology in close-loop control or statistical process control to prevent drift in one or more process parameters. In one embodiment, the IR camera 150 may be positioned above the reflector plate 135 to protect it against excessive heat and light flowing from the chamber volume 123. The IR Camera 150 may also be disposed and secured within an opening 154 defined in the cover 138. In one embodiment, a portion 152 or all of the reflector plate 135 is made of silicon (Si) or germanium (Ge) to block segments of the spectrum outside of the infrared range to minimize heat loss and improve the temperature measurement accuracy.

The Infrared (IR) camera 150 may be selected so that it will detect radiation in the infrared range of the electromagnetic spectrum (roughly about 0.9 µm to about 14 µm) and produce thermal images of that radiation. Since infrared radiation is emitted by all objects based on their temperatures, according to Kirchhoff's law of black body radiation, it is possible to see one's environment with or without visible illumination. The amount of infrared radiation emitted by an object increases with temperature, therefore the temperature of the object can be indirectly obtained by detecting and measuring the level of infrared radiation with an IR camera.

To allow the system controller 160 to independently control multiple zones 310 of the lamp assembly 133 (each zone bounded by dash lines 312 as illustrated in FIG. 3), the IR camera 150 generally provides thermal images with sufficient resolution, accuracy, and field of view to distinguish a temperature gradient between multiple areas on the surface 156A, for example, corresponding to two zones of the lamp assembly 133 that may be positioned above or below the substrate 156. In one embodiment, the IR camera 150 is capable of measuring a temperature range of about 600° C. to about 1600° C. in a spectral range of about 650 nm to about 1080 nm. In one embodiment, the IR camera 150 is coupled with a wide angle lens to provide a field of view of greater than about 33° in one direction by about 25° in the other direction to cover a large portion of the substrate surface. In one embodiment, the IR camera 150 is equipped to provide an image resolution of less than about 70 μm by about 70 μm and an image update rate of greater than about 60 frames/sec. In one embodiment, the Pyrovision M9201 thermal imaging digital camera available from Mikron Infrared, Inc., of Oakland, N.J., may be used for this application. The specifications of the IR camera 150 are not intended to be limiting as to the scope of the invention described herein.

As schematically illustrated in FIG. 1, the IR camera 150 is configured to take and deliver thermal images of the substrate to the system controller 160. The lamps 132 are connected to the system controller 160 via a lamp module controller 162. The lamp module controller 162 is configured to individually adjust and control the power level of each zone 310 of the lamp assembly 133 according to instructions from the system controller 160. In one aspect of the invention, a substrate support controller 164, comprising a position sensor assembly, is configured to monitor and control a number of parameters related to the substrate support assembly 125, such as the angular position and rotation speed of the assembly, and supply these parameters to the system controller 160. In one embodiment, the system controller 160 receives the data, such as the thermal image, angular position, and rotation speed of the substrate 156, calculates the appropriate power level of each zone 310 of the lamp assembly 133 and the appropriate rotation speed of the substrate support assembly 125, and then adjusts the power level and the rotation speed accordingly while the substrate 156 is being processed.

As shown in FIG. 1, the system controller 160 may be generally used to control one or more components found in the processing system 100, and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 160 determines which tasks are performed on a substrate. Preferably, the program is software readable by the system controller 160 that includes code to perform tasks.

FIG. 1 illustrates only one embodiment of all possible layouts of the processing system 100. Other possible layouts may include the reflector module 102 positioned below the substrate support assembly 125 and the lamp module 103 positioned above the substrate support assembly 125. The top side of the processing system 100 may be curved instead of flat. Also, the IR camera 150 may be positioned at any location where the camera has a sufficient field of view of the substrate 156 and is able to withstand the environmental factors, such as excessive heat and light, typically found in epitaxial type chambers.

Figure 2:
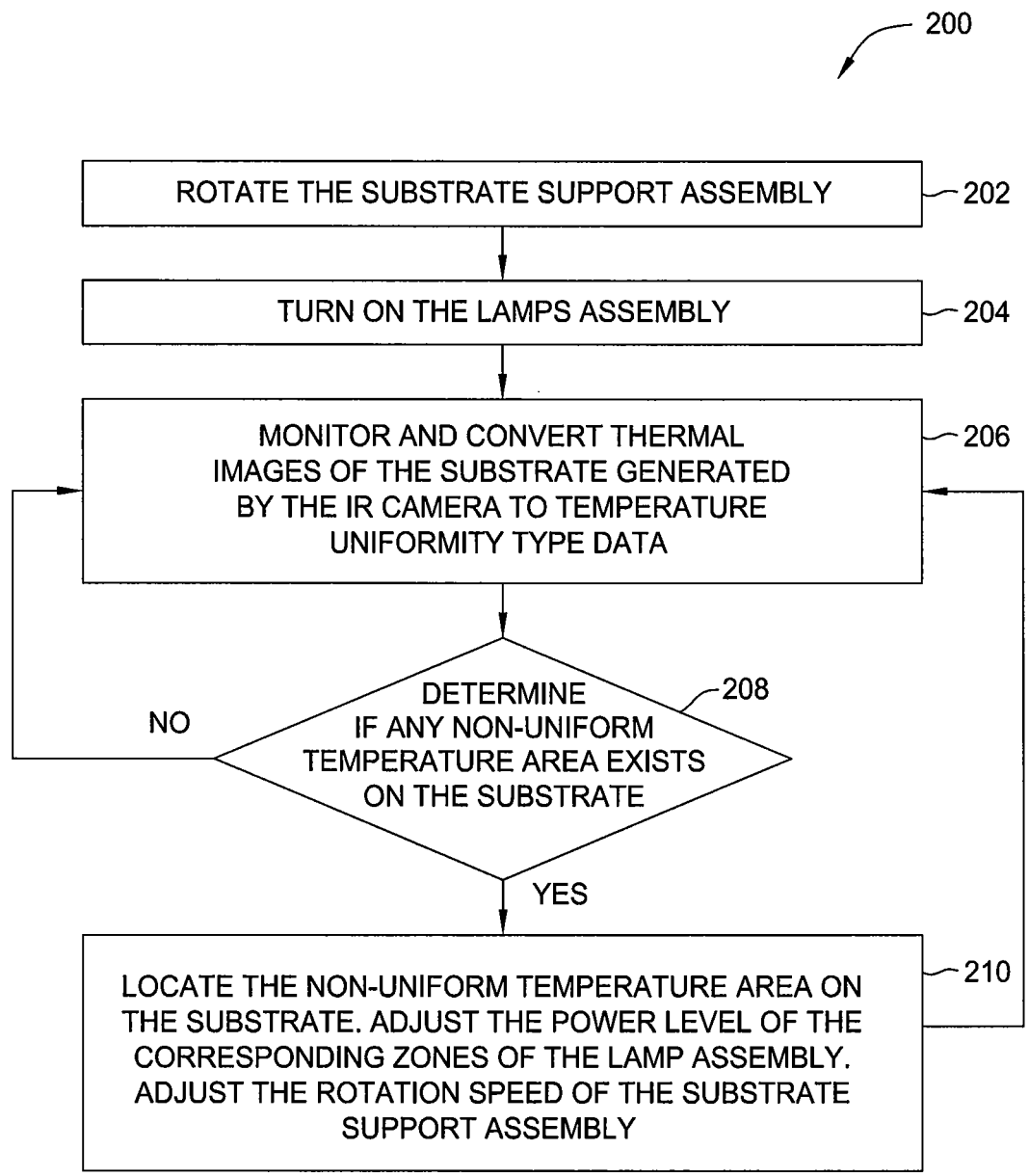
FIG. 2 illustrates a process sequence used by a system controller for real-time temperature monitoring and control according to one embodiment of the invention.

FIG. 2 illustrates a process sequence 200 used to calculate in real time the appropriate power level of each zone 310 of the lamp assembly 133 and the appropriate rotation speed of the substrate support assembly 125 by use of the thermal image, angular position, and rotation speed data collected by the system controller 160. The system controller 160 is thus used to reduce the temperature variation across the substrate 156, according to one embodiment of the invention.

After the substrate 156 is placed on the substrate support assembly 125, at step 202, the system controller 160 instructs the substrate support controller 164 to initiate rotation.

At step 204, the system controller 160 instructs the lamp module controller 162 to turn on the lamps to an initial power level.

At step 206, the system controller 160 monitors the thermal images of the substrate 156 generated by the IR camera 150 and converts the thermal images to temperature uniformity type data.

At step 208, based on the temperature uniformity type data, the system controller 160 determines which areas on the substrate 156, if any, have a temperature variation larger than a pre-determined threshold amount. If none are found, then the system controller 160 moves back to step 206. If at least one non-uniform area is found, then the system controller 160 moves to step 210.

At step 210, the system controller 160 locates the one or more zones of the lamp assembly 133 through which the non-uniform area is currently passing by use of the angular position and rotation speed of the substrate 156 provided by the substrate support controller 164. Then, the system controller 160 calculates the appropriate power level for the one or more identified zones to reduce the temperature non-uniformity, and instructs the lamp module controller 162 to adjust the power level of those zones. In conjunction with adjusting the power level, the system controller 160 calculates the appropriate rotation speed of the substrate support assembly 125 to reduce the temperature non-uniformity, and instructs the substrate support controller 164 to adjust the rotation speed of the substrate support assembly 125. In general, it is desired for the calculation and the transit of the control instructions sent by the system controller 160 to take a very short time compared to the rotation speed of the substrate 156 (e.g. up to about 30 rpm) and therefore can be ignored.

Figure 3A:
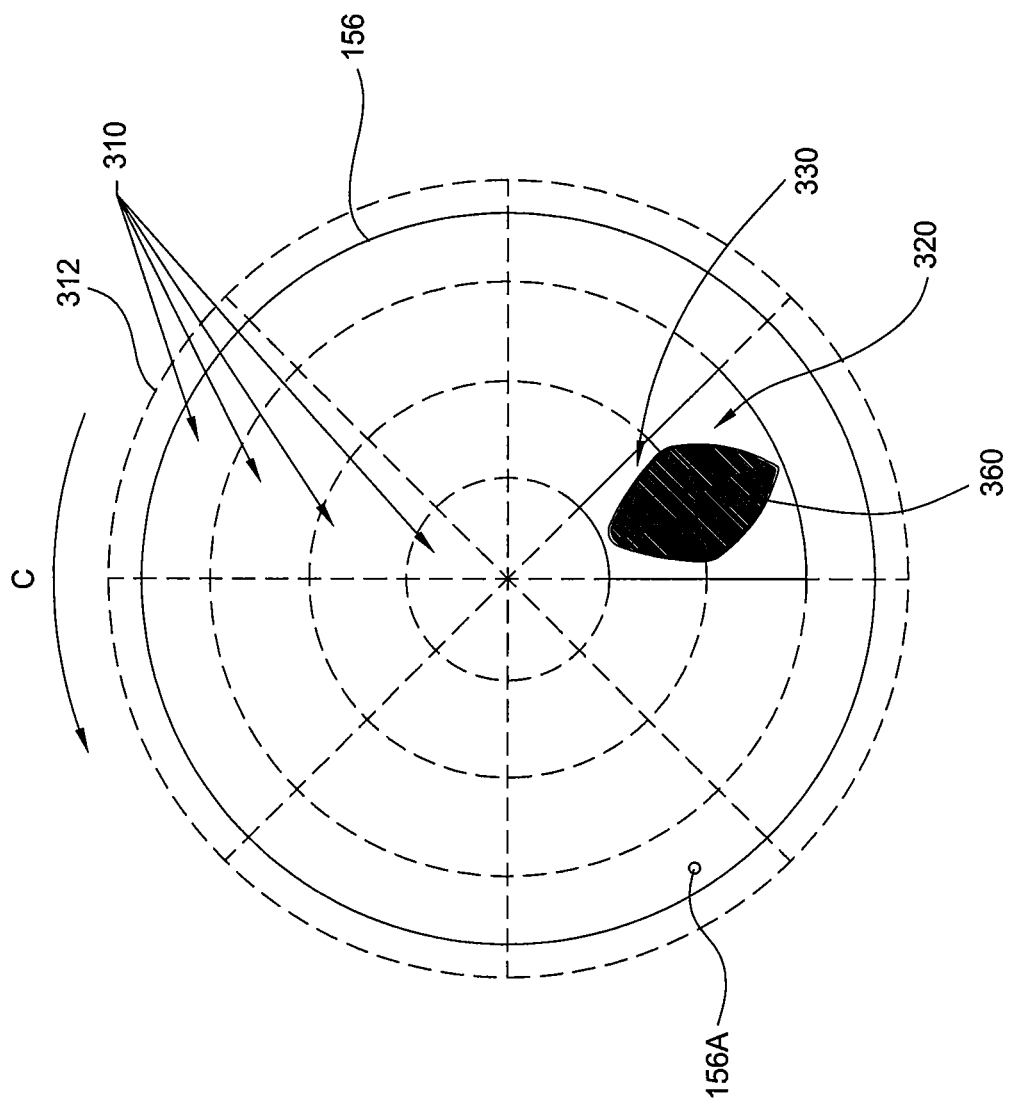
FIGS. 3A and 3B show a schematic plan view of a substrate overlaid on top of the zones of a lamp assembly and illustrate a lamp power adjustment scheme according to one embodiment of the invention.
Figure 3B:
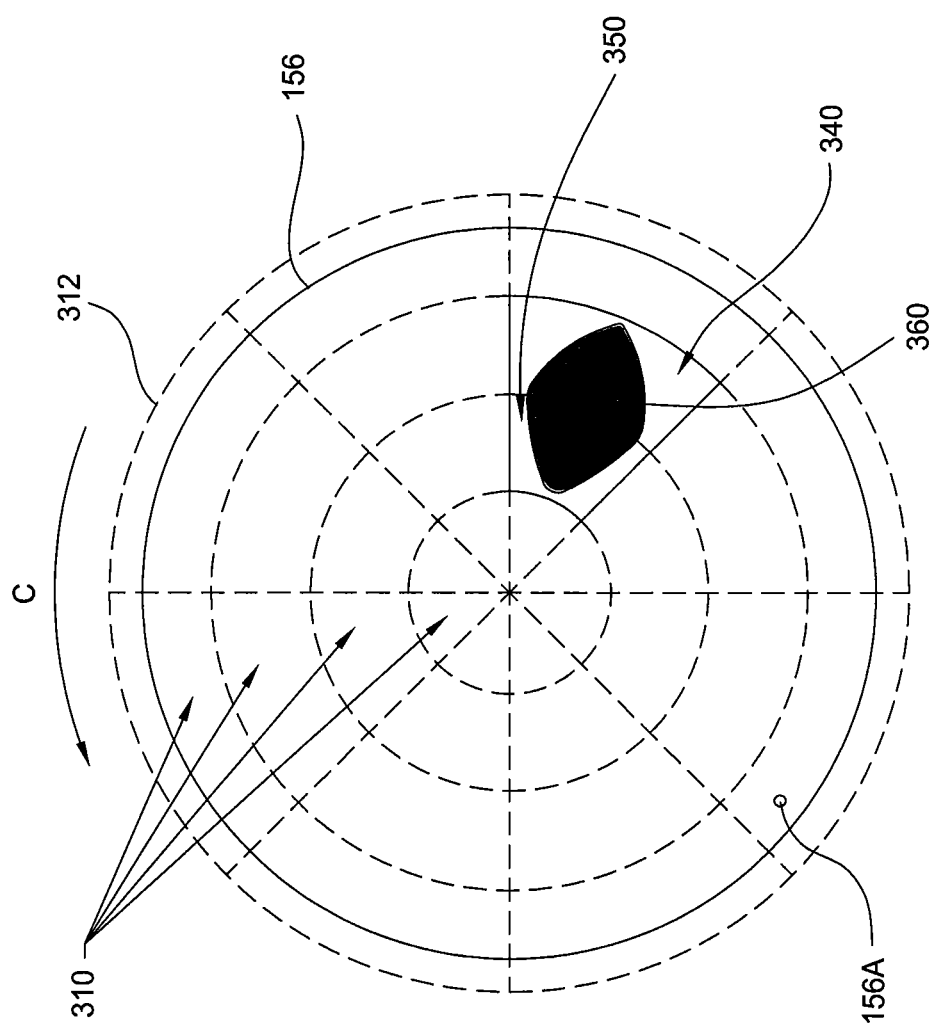

To further illustrate step 210, FIGS. 3A and 3B illustrate a plan view of the substrate 156 overlaid on top of the projected area of the zones 310 of the lamp assembly 133. In the embodiment, as shown in FIGS. 3A and 3B, the substrate 156 is circular and has a non-uniform area 360 having a temperature different from a desired value. The lamp assembly 133 is arranged into zones 310 that are radial and concentric to one another. In this example, each zone is bounded by the dash lines 312. In one embodiment, all lamps in the same zone receive the same instructions from the lamp module controller 162 and act as one unit, having the same power level, turn-on time, turn-off time, etc.

Referring to both of FIGS. 2 and 3A, at step 206 while the IR camera 150 takes a thermal image of the substrate 156 rotating in direction C, a low-temperature area 360, in this example, is passing over zones 320 and 330 of the lamp assembly 133. At steps 208 and 210, the system controller 160 determines the presence of the low-temperature area 360 relative to the other areas of the substrate. At step 210, the system controller 160 calculates the appropriate lamp power level to reduce the temperature non-uniformity and, based on the current angular position and rotation speed of the substrate 156, instructs the lamp module controller 162 to adjust the power level of the lamps in zones 320 and 330. The appropriate power level is generally based on a number of parameters, including the degree of deviation from the desired value. In this low-temperature example, the larger the deviation is, the more power (or intensity) the lamps in zones 320 and 330 will need to have to bring the temperature of the low-temperature area 360 back to an acceptable level.

In conjunction with adjusting the power level of the lamps, at step 210, the system controller 160 calculates the appropriate rotation speed of the substrate support assembly 215 to reduce the temperature non-uniformity. In this low-temperature example, the system controller 160 may decrease the rotation speed to allow a longer duration of heating over the lamps in zones 320 and 330.

Referring to both of FIGS. 2 and 3B, the system controller 160 cycles back to step 206 and instructs the IR camera 150 to take another thermal image of the substrate 156 while the low-temperature area 360 has moved to the space above zones 340 and 350 of the lamp assembly 133, in this example. At the following steps 208 and 210, the system controller 160 determines the presence of the low-temperature area 360 that is still showing a larger-than-acceptable deviation from the desired temperature value. At step 210, the system controller 160 calculates the appropriate lamp power level and substrate rotation speed to reduce the temperature non-uniformity. Based on the current angular position and rotation speed of the substrate 156, the system controller 160 instructs the lamp module controller 162 to adjust the power level of the lamps in zones 340 and 350 and the substrate support controller 164 to adjust the rotation speed of the substrate support assembly 125. And the adjustment process repeats itself until the degree of deviation in the low-temperature area 360 is minimized to within an acceptable level.

Embodiments of this invention may generally provide a processing chamber having an IR camera to facilitate an improved method of real-time monitoring and control of the temperature of a substrate in a processing system. Images taken by the IR camera are able to provide temperature profiles across various regions and/or the entire surface of the substrate, which generally provide more detailed and higher resolution temperature data than discrete or point measurements made by individual sensors, such as pyrometers. The high resolution temperature data then enable a system controller to perform real-time monitoring and control of the temperature via a feed-backward or feed-forward loop to minimize temperature non-uniformity across the substrate.

While the foregoing is directed to embodiments of the invention, other and further embodiments of the invention may be devised without departing from the basic scope thereof, and the scope thereof is determined by the claims that follow.

What is claimed is:

1. An apparatus for processing a substrate, comprising:
a chamber body having a processing volume;
a substrate support that is disposed in the processing volume;
a plurality of heat lamps configured to transfer energy to at least a region of a surface of a substrate that is disposed on the substrate support;
a lamp module controller configured to adjust and control a power level of one or more of the lamps;
a temperature sensor assembly that is configured to measure a temperature profile of the region of the surface of the substrate, wherein the temperature sensor assembly comprises an infrared camera that is positioned facing a front side of the substrate support;
a substrate support controller having a position sensor assembly, wherein the substrate support controller is coupled to the substrate support and is configured to monitor and to control an angular position and a rotation speed of the substrate support; and
a system controller that is in communication with the lamp module controller, the substrate support controller and the temperature sensor assembly wherein the system controller is configured to receive data from at least the substrate support controller and the temperature sensor assembly, to calculate appropriate power levels for the lamps and an appropriate rotation speed of the substrate support, to provide instructions to the lamp module controller to adjust the power levels of the lamps, and to provide instructions to the substrate support controller to adjust the angular position and the rotation speed of the substrate support.

2. The apparatus of claim 1, wherein the plurality of lamps are grouped into independently controllable zones.

3. The apparatus of claim 1, further comprising a reflector module, positioned to reflect energy towards the front side of the substrate support, and having a reflector plate enclosed in a cover defining a space between the reflector plate and the cover.

4. The apparatus of claim 3 further comprising a coolant inlet for the reflector module, wherein at least a portion of the infrared camera is disposed in an opening in the cover.

5. The apparatus of claim 4, wherein the infrared camera is configured to detect placement and/or breakage of the substrate.

6. The apparatus of claim 5, wherein the region of the surface of the substrate is the entire processing surface of the substrate.

7. The apparatus of claim 3, wherein the reflector plate comprises silicon or germanium.

8. A method for processing a substrate, comprising:
placing a substrate on a substrate support;
heating a first region of a surface of the substrate using a heat source positioned facing a back side of the substrate support and configured to transfer energy to the first region of the surface of the substrate, wherein the heat source comprises a plurality of lamps that are grouped into independently controllable zones;
forming a first thermal image of the first region of the surface of the substrate using an infrared camera and sending the first thermal image to a system controller, wherein the infrared camera is positioned facing a front side of the substrate support;

using the system controller to determine a location of a first area of temperature non-uniformity on the surface of the substrate using the first thermal image and to calculate appropriate power levels for the lamps and an appropriate rotation speed of the substrate support;

providing instructions from the system controller to a lamp module controller to adjust the energy delivered by a first zone of heating elements to reduce the temperature non-uniformity, wherein the first zone of lamps is positioned closer to the first area of temperature non-uniformity than all other zones of heating elements; and providing instructions from the system controller to a substrate support controller to adjust the rotation speed of the substrate support to the appropriate rotation speed of the substrate support.

9. The method of claim 8, further comprising forming a second thermal image of the first region of the surface of the substrate using an infrared camera.

10. The method of claim 8, further comprising:
rotating the substrate; and
measuring the angular position or rotation speed of the substrate, wherein the determining the location of a first area of temperature non-uniformity is based on the first thermal image and the measured angular position or rotation speed of the substrate.

11. The method of claim 8, further comprising:
comparing the first thermal image against a desired target temperature profile.

12. The method of claim 8, further comprising:
forming a third thermal image of a second region of the surface of the substrate using the infrared camera;
determining the location of a second area of temperature non-uniformity on the surface of the substrate using the second thermal image; and
adjusting the energy delivered by a second zone of heating elements to reduce the temperature non-uniformity, wherein the second zone of heating elements is positioned closer to the second area of temperature non-uniformity than all other zones of heating elements.

13. The method of claim 12, wherein the determining the location of a second area of temperature non-uniformity is based on the second thermal image and the measured angular position or rotation speed of the substrate.

14. An apparatus for processing a substrate, comprising:
a chamber body having a processing volume;
a substrate support that is disposed in the processing volume;
a plurality of heat lamps positioned facing a back side of the substrate support and configured to transfer energy to at least a region of a surface of a substrate that is disposed on the substrate support;
a lamp module controller configured to adjust and control a power level of one or more of the lamps;
a temperature sensor assembly that is configured to measure a temperature profile of the region of the surface of the substrate, wherein the temperature sensor assembly comprises an infrared camera that is positioned facing a front side of the substrate support;
a substrate support controller having a position sensor assembly, wherein the substrate support controller is coupled to the substrate support and is configured to monitor and to control an angular position and a rotation speed of the substrate support; and
a system controller that is in communication with the lamp module controller, the substrate support controller and the temperature sensor assembly, wherein the system controller is configured to receive data from at least the substrate support controller and the temperature sensor assembly, to calculate appropriate power levels for the lamps and an appropriate rotation speed of the substrate support, to provide instructions to the lamp module controller to adjust the power levels of the lamps, and to provide instructions to the substrate support controller to adjust the angular position or the rotation speed of the substrate support.

15. The apparatus of claim 14, further comprising a reflector module, positioned to reflect energy towards the front side of the substrate support, and having a reflector plate enclosed in a cover defining a space between the reflector plate and the cover.

16. The apparatus of claim 15, further comprising a coolant inlet for the reflector module, wherein at least a portion of the infrared camera is disposed in an opening in the cover.

17. The apparatus of claim 16, wherein the infrared camera is configured to detect placement and/or breakage of the substrate.

18. The apparatus of claim 17, wherein the region of the surface of the substrate is the entire processing surface of the substrate.

19. The apparatus of claim 18, wherein the plurality of lamps are grouped into independently controllable zones.

20. The apparatus of claim 19, wherein the reflector plate comprises silicon or germanium.

* * * * *